(12) United States Patent
Bell et al.

(10) Patent No.: US 12,414,468 B2
(45) Date of Patent: Sep. 9, 2025

(54) PROCESS FOR ANNEALING A POLED CERAMIC

(71) Applicant: Ionix Advanced Technologies Ltd, Huddersfield (GB)

(72) Inventors: Andrew John Bell, Cumbria (GB); Timothy Paul Alistair Comyn, West Yorkshire (GB)

(73) Assignee: IONIX ADVANCED TECHNOLOGIES LTD, Huddersfield (GB)

( * ) Notice: Subject to any disclaimer, the term of this patent is extended or adjusted under 35 U.S.C. 154(b) by 1077 days.

(21) Appl. No.: 17/253,527

(22) PCT Filed: Jun. 12, 2019

(86) PCT No.: PCT/GB2019/051621
§ 371 (c)(1),
(2) Date: Dec. 17, 2020

(87) PCT Pub. No.: WO2019/243778
PCT Pub. Date: Dec. 26, 2019

(65) Prior Publication Data
US 2021/0143318 A1 May 13, 2021

(30) Foreign Application Priority Data
Jun. 21, 2018 (GB) .................................. 1810184

(51) Int. Cl.
*H10N 30/045* (2023.01)
*C04B 35/26* (2006.01)
(Continued)

(52) U.S. Cl.
CPC .......... *H10N 30/045* (2023.02); *C04B 35/26* (2013.01); *C04B 35/64* (2013.01);
(Continued)

(58) Field of Classification Search
CPC ... H10N 30/045; H10N 30/8561; C04B 35/26
See application file for complete search history.

(56) References Cited

U.S. PATENT DOCUMENTS 5,702,629 A 12/1997 Cui et al.
6,403,012 B1 6/2002 Tomohiro et al.
(Continued)

FOREIGN PATENT DOCUMENTS

AU 2011284482 A1 3/2013
CN 1644562 A 7/2005
(Continued)

OTHER PUBLICATIONS

Yuang. Structural, microstructural and electrical properties of BiFeO3—BaTiO3ceramics with high thermal stability. Materials Research Bulletin 47 (2012) 4233-4239 (Year: 2012).*
(Continued)

*Primary Examiner* — Matthew E. Hoban
(74) *Attorney, Agent, or Firm* — Harness, Dickey & Pierce, PLC

(57) ABSTRACT

The present invention relates to a process for annealing a poled ceramic over a heating period during which the temperature is raised incrementally to "lock-in" desirable high temperature characteristics.

11 Claims, 6 Drawing Sheets

Figure 1:
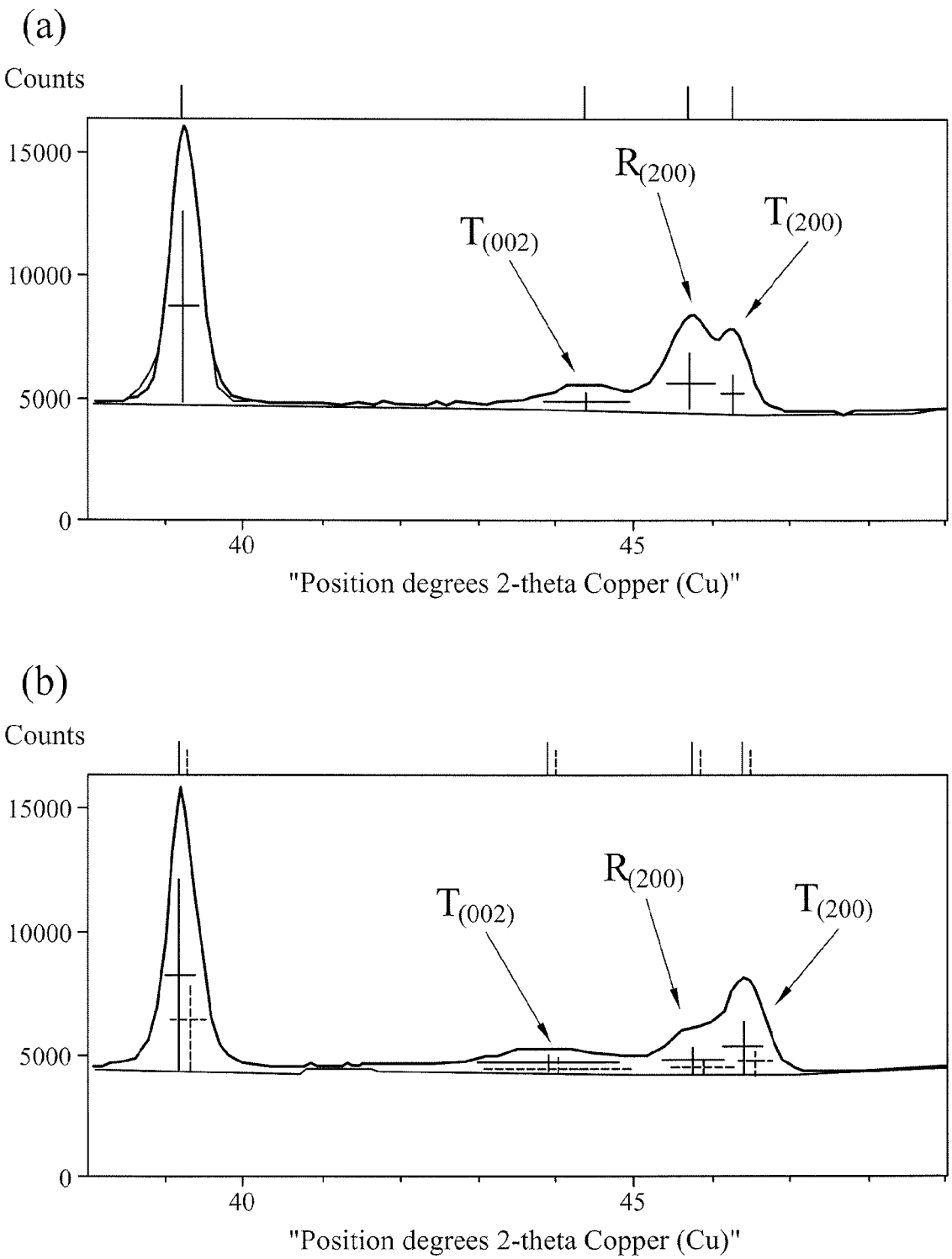

(51) Int. Cl.
 C04B 35/64 (2006.01)
 H10N 30/853 (2023.01)
(52) U.S. Cl.
 CPC . H10N 30/8561 (2023.02); C04B 2235/3234
  (2013.01); C04B 2235/3274 (2013.01); C04B
  2235/6562 (2013.01); C04B 2235/768
  (2013.01)

(56) References Cited

U.S. PATENT DOCUMENTS

| | | | |
|---|---|---|---|
| 6,497,660 | B1 | 12/2002 | Dillman et al. |
| 2005/0075235 | A1 | 4/2005 | Azuma et al. |
| 2007/0208509 | A1 | 9/2007 | Davis et al. |
| 2008/0134795 | A1 | 6/2008 | Zhang |
| 2013/0161556 | A1 | 6/2013 | Jeon et al. |
| 2014/0292160 | A1* | 10/2014 | Kubota .............. H10N 30/8536 310/365 |

FOREIGN PATENT DOCUMENTS

| | | |
|---|---|---|
| CN | 101935215 A | 1/2011 |
| CN | 102167585 A | 8/2011 |
| CN | 103467081 A | 12/2013 |
| CN | 104671766 A | 6/2015 |
| CN | 105957958 A | 9/2016 |
| CN | 106518071 A | 3/2017 |
| CN | 106554202 A | 4/2017 |
| CN | 106927809 A | 7/2017 |
| CN | 107244913 A | 10/2017 |
| CN | 108046802 A | 5/2018 |
| JP | H0818373 A | 1/1996 |
| JP | 2005072797 A | 3/2005 |
| JP | 2011230962 A | 11/2011 |
| LV | 11236 B | 8/1996 |
| WO | WO-2012044309 A1 | 4/2012 |
| WO | 2016124941 A1 | 8/2016 |

OTHER PUBLICATIONS

Bennett. Exceptionally large piezoelectric strains in BiFeO3-(K0.5Bi0.5)TiO3—PbTiO3 ceramics. Scripta Materialia 68 (2013) 491-494 (Year: 2013).*
Great Britain Search Report for Application No. GB1810184.0 dated Apr. 11, 2019.
International Search Report and Written Opinion of the International Searching Authority, issued in PCT/GB2019/051621, mailed Sep. 5, 2019; ISA/EP.
International Preliminary Report on Patentability, issued in PCT/GB2019/051621, dated Dec. 12, 2020; ISA/EP.
International Preliminary Report on Patentability, issued in PCT/GB2019/051621, dated May 12, 2020; ISA/EP.
Great Britain Search Report for Application No. GB1810184.0 dated Apr. 10, 2019.
Chinese First Office Action for Application No. CN2019800415208, dated Nov. 17, 2023 (6 Pages).
Liao, Qinwei et al., "Origin of Thermal Depolarization in Piezoelecric Ceramics," Scripta Materialia, Jan. 13, 2016 (5 Pages).
Anton, Eva-Maria et al., "Determination of Depolarization Temperature of (Bi1/2Na1/2) Tio2-Based Lead-Free Piezoceramics," Journal of Applied Physics, Nov. 15, 2011 (6 Pages).
Zhang, Shujun et al., "Dielectric and Piezoelectric Properties of Niobium-Modifuied BiInO3—PbTiO3, Perovskite Ceramics With High Curie Temperatures," J. Mater. Res., vol. 20, No. 8, Aug. 2005 (5 Pages).
Qin, Bao-quan et al., "Preparation and Characterization of (1-x)BiInO3-xPbTiO3 ceramics, "16th IEEE International Symposium on the Applications of Ferroelectrics, 2007 (2 Pages).
Chen, Jun et al., "Temperature Dependence of Piezoelectric Properties of High-Tc Bi (Mg1/2Ti1q/2) O3—PbTiO3," Journal of Applied Physics, Aug. 10, 2009 (7 Pages).
Shi, Liang et al., "Piezoelectric Properties of Fe2O3 Doped BiYbO3-Pb(Zr,Ti)O3, High CVurie Temperature Ceramics," Science Direct, Oct. 17, 2013 (7 Pages).
Feng, Gao et al., "Phase Formation and Chasracterizastion of High VCurie Temperature xBiYbox-(1-X)PbTiO3 Piezoelectric Ceramics," Science Direct, Nov. 12, 2008 (7 Pages).
Feng, Gao et al., "Phase Structure and Piezoelectric Properties of High Curie Temperature BiYbO3-PbTiO3-BaTio3 Ceramics," Journal of Alloys and Compounds, Sep. 18, 2008 (5 Pages).
Suchomel, Matthew et al., "Enhanced Tetragonality in (x) PbTio3-(1-x) Bi (Zn1/2Ti1/2) 03 and Related Solid Solution Systems," American Institute of Physics, Jun. 23, 2005 (3 Pages).
Fujii, Ichiro et al., "Structural, Dielectric, and Piezoelectric Properties of Mn-Doped BaTiO3-Bi(Mg1/2Ti1/2) O3-BiFeO3 Ceramics," Japanese Journal of Applied Physics, No. 50, Sep. 20, 2011 (4 Pages).
Calisir, Ilkan et al., "Chemical Heterogeneity and Approaches to its Control in BiFeO3-BaTiO3 Lead Free Ferroelecrics," Journal of Materials Chemistry C, Dec. 4, 2017 (13 Pages).
Chen, Jianguo et al., "Review on High Temperature Piezoelectric Ceramics and Actuators Based on BiScO3-PbTiO3, Solid Solutions," Journal of Advanced Dielectrics, Mar. 27, 2014 (14 Pages).
Comyn, T.P et al., "Process and Electrical Properties of BiFeO3-PbTiO3 Ceramics," Science Direct, Jul. 5, 2004 (3 Pages).
Comyn, T.P et al., "Piezoelectric Properties of BiFeO3-PbTiO3 Ceramics," J. Phys. IV France, Aug. 8, 2005 (6 Pages).
Rojac, Tadej et al., "Strong Ferroelectric Domain-Wall Pinning in BiFeO3 Ceramics," Journal of Applied Physics, No. 108, Oct. 7, 2010 (8 Pages).
Jiang, Xiang-Ping et al., "High Performance Aurivillus Type Na0.5Bi4.5Ti4O15 Piezoelectric Ceramics With Neodymium and Cerium Modification," Journal of Advanced Ceramics, 2015 (7 Pages).
Duan, Runrun et al., "High Curie Temperature Perovskite BiInO3-PbTiO3 Ceramics," J. Mater. Res., vol. 19, Jul. 2004 (9 Pages).
Lee, Myang Hwan et al., "High-Performance Lead-Free Piezoceramics With High Curie Temperatures," Advanced Materials, 2015 (7 Pages).
Wang, Chun-Ming et al., "Elecromechanical Properties of A—Site (LiCe)-Modified Sodium Bismuth Titanate (Na0.5Bi4.5TiO15) Piezoelectric Ceramics at Elevated Temperature," Journal of Applied Physics, No. 105, May 12, 2009 (5 Pages).
Zhang, Shujun et al., "Piezoelectric Materials For High Power, High Temperature Applications," Science Direct, Material Letters 59, Jul. 14, 2005 (5 Pages).
Li, Bao-Wen et al., "RbBiNb2O7: A New Lead-Free High-Tc Ferroelectric," Chemistry of Materials, American Chemical Society, No. 24, Aug. 2, 2012 (3 Pages).
Sunder, V.V.S.S. Sai et al., "Investigation of Tetragonal Distortion in the PbTTiO3-BiFeO3 System by High-Temperature X-Ray Diffraction," J. Mater. Res., vol. 10, No. 5, May 1995 (6 Pages).
Gao, Zhipeng et al., "Super Stable Ferroelectrics With High Curie Point," Scientific Reports, Apr. 7, 2016 (6 Pages).
Wang, Chun-Ming et al., "Enhanced Piezoelectric Properties of Sodium Bismuth Titanate (Na0.5Bi4.5Ti4O15) Ceramics with B-Site Cobalt Modification," Phys. Status Solid RRL 3, No. 1, 7-9, Oct. 28, 2008 (3 Pages).
Zhang, Qiang et al., "Structural and Dielectric Properties of Bi (Mg1/2Ti1/2) O3—BaTiO3 Lead-Free Ceramics," J. Am. Ceram. Soc., No. 94, Manuscript No. 29489, May 15, 2011 (5 Pages).
Wei, Yongxing et al., "Polar Order Evolutions Near the Rhombohedral to Pseudocubic and Tetragonal to Pseudocubic Phase Boundaries of the BiFeO3—BaTiO3 System," Materials, MDPI, Dec. 2, 2015 (10 Pages).
"Very High Remnant Polarization and Phase-Change Electromechanical Response of BiFeO3—PbTiO3 at the Multiferroic Morphotropic Phase Boundary," Applied Physics Letters, American Institute of Physics, No. 101, Oct. 25, 2012 (5 Pages).
Lin. Microstructure, ferroelectric and piezoelectric properties of Bi0.5K0.5TiO3-modified BiFeO3-BaTiO3lead-free 1 ceramics with high Curie temperature. Journal of the European Ceramic Society 33 (2013) 3023-3036 (Year: 2013).

(56) References Cited

OTHER PUBLICATIONS

Chinese Second Office Action for Chinese Application No. 201980041520.8, dated Apr. 25, 2024 (12 Pages).

* cited by examiner

PROCESS FOR ANNEALING A POLED CERAMIC

CROSS-REFERENCE TO RELATED APPLICATIONS

This application is a 371 U.S. National Phase of International Application No. PCT/GB2019/051621, filed Jun. 12, 2019, which claims priority to British Patent Application No. 1810184.0, filed Jun. 21, 2018. The entire disclosures of the above applications are incorporated herein by reference.

The present invention relates to a process for annealing a poled ceramic, to a poled ceramic per se and to the use of the poled ceramic in a piezoelectric device.

Piezoelectric materials generate an electric field in response to applied mechanical strain. The effect is attributable to a change of polarization density within the material. The piezoelectric effect is reversible in the sense that stress or strain is induced when an electric field is applied to the material. These properties are deployed in piezoelectric sensors and actuators which are used widely in a number of specific applications and instruments. Examples of the use of piezoelectric materials include medical ultrasound and sonar, acoustics, vibration control, spark igniters and diesel fuel injection.

The family of ceramics with a perovskite or tungsten-bronze structure exhibits piezoelectric behaviour. For example, lead zirconate titanate ($Pb[Zr_xTi_{1-x}]O_3$ $0<x<1$) which is more commonly known as PZT has dominated the piezoelectric market for over half a century and exhibits a marked piezoelectric effect. However the temperature at which PZT can be used is very dependent on (a) the particular material, (b) the architecture/application, (c) the drive conditions (for example the vector of the electric field) and (d) the duration of operation. It is generally accepted that the maximum temperature at which PZT can be used continuously is 200-250° C.

The Curie point ($T_c$), the low field piezoelectric coefficient ($d_{33}$) measured at room temperature and the operating temperature or depolarising temperature ($T_d$) are often used to characterise the high temperature performance of a piezoelectric ceramic. Typically a material with a high $T_c$ is difficult to pole, has a low $d_{33}$ value and has a $T_d$ much lower than $T_c$. Thus whilst there are high $T_c$ materials which are able to operate at a higher temperature than PZT, none have a $d_{33}$ value of >50 and $T_d$ anywhere near to $T_c$ (eg >600° C.). There are examples of very high $T_c$ materials but these can be extremely difficult to pole (eg niobium-modified $BiInO_3$—$PbTiO_3$ and $xPbTiO_3$-$(1-x)Bi(Zn_{1/2}Ti_{1/2})O_3$).

As a quality control measure prior to shipping, poled pellets are annealed to seek to ensure that the ceramic is able to function at (for example) 350° C. for a significant period of time. However the conventional heating protocol produces a pellet with poor high temperature characteristics.

The present invention is based on the recognition that judicious incremental heating of a poled ceramic over a high temperature range can serve to "lock-in" desirable high temperature characteristics.

Viewed from a first aspect the present invention provides a process for annealing a poled ceramic which comprises (or consists essentially of) a solid solution with a perovskite structure, wherein the process comprises:
(A) heating the poled ceramic over a heating period from ambient temperature to a final temperature, wherein during at least a final part of the heating period the temperature is raised incrementally; and
(B) cooling the poled ceramic from the final temperature to ambient temperature to form an annealed poled ceramic.

The annealing process of the invention advantageously forms an annealed poled ceramic which exhibits a high Curie point ($T_C$) and/or a low field piezoelectric activity ($d_{33}$) (as measured by a Berlincourt ($d_{33}$) meter (APC International)) and/or a high depolarising temperature ($T_d$).

Typically the annealed poled ceramic exhibits a low field piezoelectric activity ($d_{33}$) of 50 or more, a Curie point ($T_c$) of 650° C. or more and a depolarising temperature ($T_d$) which is substantially coincident with the Curie point ($T_c$).

Preferably the annealed poled ceramic exhibits a low field piezoelectric activity ($d_{33}$) of 55 or more, particularly preferably 60 or more, more preferably 70 or more, yet more preferably 80 or more, even more preferably 100 or more.

Preferably the annealed poled ceramic exhibits a depolarising temperature ($T_d$) and a Curie point ($T_C$) which in ° C. are in a ratio which is in the range 0.7 to 1.3, particularly preferably 0.8 to 1.2, more preferably 0.9 to 1.1.

Preferably the annealed poled ceramic exhibits a depolarising temperature ($T_d$) of 580° C. or more, particularly preferably 600° C. or more.

Preferably the annealed poled ceramic exhibits a Curie point ($T_C$) of 650° C. or more, particularly preferably 665° C. or more, more preferably 680° C. or more.

During at least the final part of the heating period, the temperature may be raised incrementally in intervals or steps. During at least the final part of the heating period, the temperature may be raised incrementally at a constant rate.

Typically the final part of the heating period commences when the temperature is within 150° C. or more of the final temperature, preferably within 200° C. or more of the final temperature, particularly preferably within 240° C. or more of the final temperature.

In a preferred embodiment, the temperature is raised incrementally during substantially the whole of the heating period.

During at least the final part of the heating period, the temperature is preferably raised at an average rate (preferably a constant rate) of 15° C./hour or less, particularly preferably an average heating rate of 8° C./hour or less, more preferably an average heating rate in the range 1 to 4° C./hour, most preferably about 2° C./hour.

In a preferred embodiment, the process further comprises:
(A1) causing the poled ceramic to dwell for an intermediate period at an intermediate temperature between ambient temperature and the final temperature.

The intermediate period may be 4 hours or more, preferably 8 hours or more, particularly preferably 16 hours or more.

The intermediate temperature may be within 240° C. or less of the final temperature, preferably within 200° C. or less of the final temperature, particularly preferably within 150° C. or less of the final temperature.

In a preferred embodiment, the process further comprises:
(A2) causing the poled ceramic to dwell for an additional heating period at the final temperature.

The additional heating period may be 4 hours or more, preferably 8 hours or more, particularly preferably 16 hours or more.

Step (B) may be carried out in a single step or incrementally (eg in intervals or steps). In a preferred embodiment, step (B) is carried out in a single step.

Step (B) may be carried out at an average rate (preferably a constant rate) of 300° C./hour or more.

The poled ceramic may be in any self-supporting form (eg a pellet or disc).

The ceramic may be poled to produce the poled ceramic according to conventional means well-known to those skilled in the art.

Preferably the ceramic consists essentially of the solid solution. For example, the solid solution may be present in the ceramic in an amount of 50 wt % or more (eg in the range 50 to 99 wt %), preferably 75 wt % or more, particularly preferably 90 wt % or more, more preferably 95 wt % or more.

The solid solution may be a partial solid solution. Preferably the solid solution is a complete solid solution. The solid solution may be substantially monophasic. The solid solution may be biphasic.

Preferably the solid solution has two of the group consisting of a rhombohedral phase, a monoclinic phase, an orthorhombic phase and a tetragonal phase. The solid solution may have a rhombohedral phase and a monoclinic phase. The solid solution may have a rhombohedral phase and orthorhombic phase. Preferably the solid solution has a tetragonal phase and a rhombohedral phase.

The solid solution may be a binary, ternary or quaternary solid solution.

Preferably the ceramic is substantially free of non-perovskite phases. The amount of non-perovskite phases present in the ceramic may be such that the phases are non-discernible in an X-ray diffraction pattern. The amount of non-perovskite phases present in the ceramic may be a trace amount.

Preferably the total amount of non-perovskite phases present in the ceramic is less than 10 wt %, particularly preferably less than 8 wt %, more preferably less than 5 wt %, yet more preferably less than 2 wt %, still yet more preferably less than 1 wt %, most preferably less than 0.1 wt %.

Preferably the ceramic further comprises one or more perovskite phases.

Preferably the ceramic comprises (or consists essentially of) a solid solution which is lead-containing. Particularly preferably the lead-containing solid solution contains $PbTiO_3$. Particularly preferably the lead-containing solid solution contains Bi, Ti and Pb.

Preferably the ceramic comprises (or consists essentially of) a solid solution which is lead-free. Particularly preferably the lead-free solid solution contains $BaTiO_3$. Particularly preferably the lead-free solid solution contains Bi, Ti and Ba.

In a preferred embodiment, the solid solution is of formula (I):

$$x(Bi_a[A]_{1-a})TiO_3\text{-}yBi_b[B]O_3\text{-}z[A']TiO_3 \qquad (I)$$

wherein:
[A] denotes sodium, potassium or lithium;
[B] denotes iron, lanthanum, indium, scandium or ytterbium;
[A'] denotes lead, barium, calcium, strontium or a mixture thereof;
$0.4 \leq a \leq 0.6$;
$0.7 \leq b \leq 1.0$
$0 \leq x < 1$;
$0 \leq y < 1$; and
$0 < z \leq 0.5$,
wherein x+y>0 and x+y+z=1.

The ceramic may further comprise one or more perovskite phases selected from the group consisting of $Bi_a[A]_{1-a}TiO_3$, $Bi[B]O_3$ and $[A']TiO_3$. The (or each) perovskite phase may be present in an amount of 75 wt % or less, preferably 50 wt % or less, particularly preferably 25 wt % or less, more preferably 5 wt % or less. The (or each) perovskite phase may be present in a trace amount.

The ceramic may further comprise one or more non-perovskite phases. The non-perovskite phases may be mixed metal phases of two or more (eg three) of Bi, [A], Ti, [B] or [A'].

Preferably a is in the range 0.45 to 0.55. Particularly preferably a is in the range 0.48 to 0.52. More preferably a is 0.50.

Preferably b is 1.

Preferably $0 < z \leq 0.35$. Particularly preferably z is in the range 0.175 to 0.35.

Preferably y is in the range 0.1 to 0.9. Particularly preferably y is in the range 0.1 to 0.6. Alternatively particularly preferably y is in the range 0.4 to 0.9 (eg 0.55 to 0.725).

Preferably x is in the range 0.1 to 0.9. Particularly preferably x is in the range 0.1 to 0.4 (eg 0.1 to 0.275). Alternatively particularly preferably x is in the range 0.7 to 0.9.

In a preferred embodiment, x is 0 and 0<y<1.
In a preferred embodiment, 0<x<1 and y is 0.
In a preferred embodiment, 0<x<1 and 0<y<1.

Preferably [A'] is lead or barium. Particularly preferably [A'] is lead. Alternatively particularly preferably [A'] is barium.

Preferably [A] is potassium.
Preferably [B] is iron.

Particularly preferably the solid solution is of formula (II):

$$x(Bi_aK_{1-a})TiO_3\text{-}yBiFeO_3\text{-}zPbTiO_3 \qquad (II).$$

More preferably in the solid solution of formula (II), 0<x<1 and 0<y<1. Alternatively more preferably in the solid solution of formula (II), x is 0 and 0<y<1.

Alternatively particularly preferably x is 0 and the solid solution is of formula (III):

$$yBiFeO_3\text{-}zBaTiO_3 \qquad (III).$$

More preferably in the solid solution of formula (III), y is in the range 0.67 to 0.8.

In the solid solution of formula (I), one or more of Bi, [A], [B], [A'] and Ti may be substituted by a metal dopant. The metal dopant for each substitution may be the same or different.

The (or each) metal dopant may be present in an amount up to 50 at %, preferably up to 20 at %, particularly preferably up to 10 at %, more particularly preferably up to 5 at %, yet more preferably up to 3 at %, most preferably up to 1 at %.

The metal dopant may be an A-site metal dopant. For example, the A-site metal dopant may substitute one or more of Bi, [A] and [A']. Preferably the A-site metal dopant is selected from the group consisting of Li, Na, Ca, Sr, Ba and a rare earth metal (eg La or Nd).

The metal dopant may be a B-site metal dopant. For example, the B-site metal dopant may substitute [B] and/or Ti. The B-site metal dopant may be magnesium or zinc.

A preferred B-site metal dopant has a higher valency than the valency of the metal which it substitutes. In a particularly preferred embodiment, the B-site metal dopant has a valency in the range IV to VII. More particularly preferred is a B-site metal dopant selected from the group consisting of Ti, Zr, W, Nb, V, Ta, Fe, Co, Mo and Mn.

The solid solution may exhibit A-site vacancies (eg Bi, [A] or [A'] vacancies)

The solid solution may exhibit B-site vacancies (eg [B] or Ti vacancies).

The solid solution may exhibit oxygen vacancies.

In a preferred embodiment, the ceramic is obtainable by a process comprising:
(a) preparing an intimate mixture of a substantially stoichiometric amount of a compound of each of Bi, Ti, [A], [A'] and [B];
(b) converting the intimate mixture into an intimate powder;
(c) inducing a reaction in the intimate powder to produce a mixed metal oxide;
(d) manipulating the mixed metal oxide into a sinterable form; and
(e) sintering the sinterable form of the mixed metal oxide to produce the ceramic.

The compound of each of Bi, Ti, [A], [A'] and [B] may be an organometallic compound. The compound of each of Bi, Ti, [A], [A'] and [B] may be independently selected from the group consisting of an oxide, nitrate, hydroxide, halide, sulphate, carbonate, hydrogen carbonate, isopropoxide, polymer, acetate, carboxylate, alkoxide and acetylacetonate.

The intimate mixture may be a slurry (eg a milled slurry), a solution (eg an aqueous solution), a suspension, a dispersion, a sol-gel or a molten flux.

Step (c) may include heating (eg calcining). Preferably step (c) includes stepwise or interval heating. Step (c) may include stepwise or interval cooling.

Preferably the intimate powder is a milled powder.

Step (e) may be stepwise or interval sintering. Step (e) may include stepwise or interval heating and stepwise or interval cooling.

Step (d) may include milling the mixed metal oxide. Step (d) may include pelletising the mixed metal oxide.

From an independently patentable viewpoint, the present invention is based on the recognition that certain annealed poled ceramics have hitherto inaccessible high temperature characteristics.

Viewed from a further aspect the present invention provides an annealed poled ceramic which comprises (or consists essentially of) a solid solution with a perovskite structure, wherein the annealed poled ceramic exhibits a low field piezoelectric activity ($d_{33}$) of 50 or more, a Curie point ($T_C$) of 650° C. or more and a depolarising temperature ($T_d$) which is substantially coincident with the Curie point ($T_C$).

Preferably the annealed poled ceramic exhibits a low field piezoelectric activity ($d_{33}$) of 55 or more, particularly preferably 60 or more, more preferably 70 or more, yet more preferably 80 or more, even more preferably 100 or more.

Preferably the annealed poled ceramic exhibits a depolarising temperature ($T_d$) and a Curie point ($T_C$) which are in a ratio which is in the range 0.7 to 1.3, particularly preferably 0.8 to 1.2, more preferably 0.9 to 1.1.

Preferably the annealed poled ceramic exhibits a depolarising temperature ($T_d$) of 580° C. or more, particularly preferably 600° C. or more.

Preferably the annealed poled ceramic exhibits a Curie point ($T_C$) of 650° C. or more, particularly preferably 665° C. or more, more preferably 680° C. or more.

In this aspect of the invention, the ceramic may be as hereinbefore defined.

Viewed from a still yet further aspect the present invention provides the use of an annealed poled ceramic as hereinbefore defined in a piezoelectric device.

The piezoelectric device may be a piezoelectric actuator, sensor or transformer.

Preferably in the use according to the invention the piezoelectric device is deployed in an aero-engine.

Figure 2:
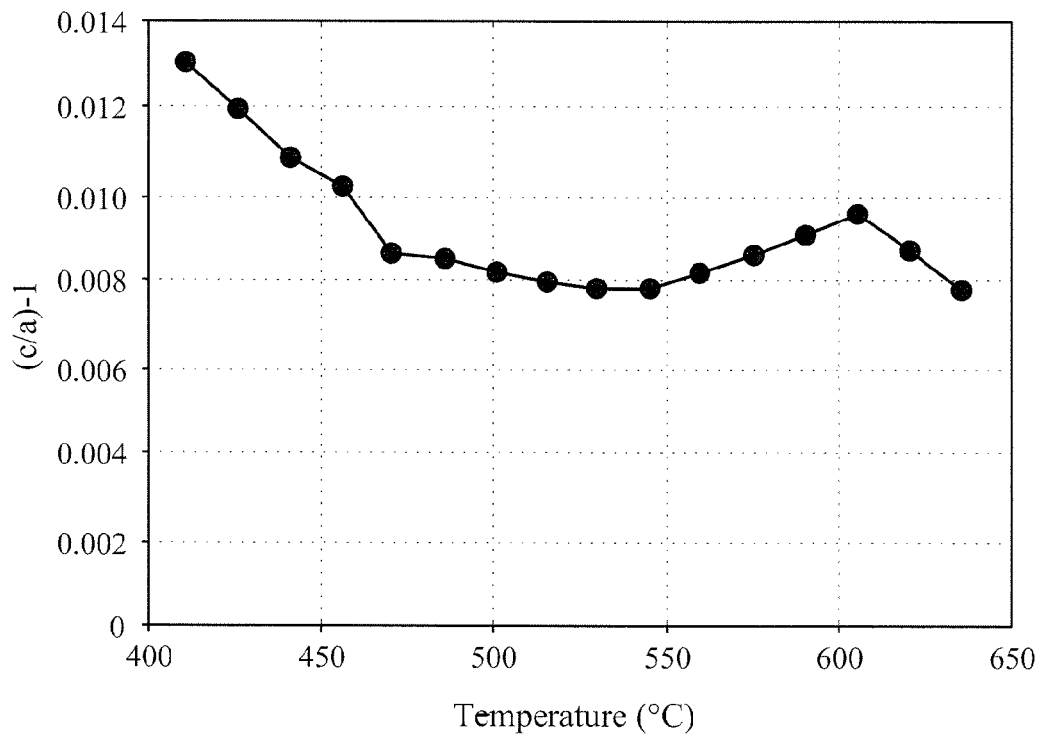
Figure 3:
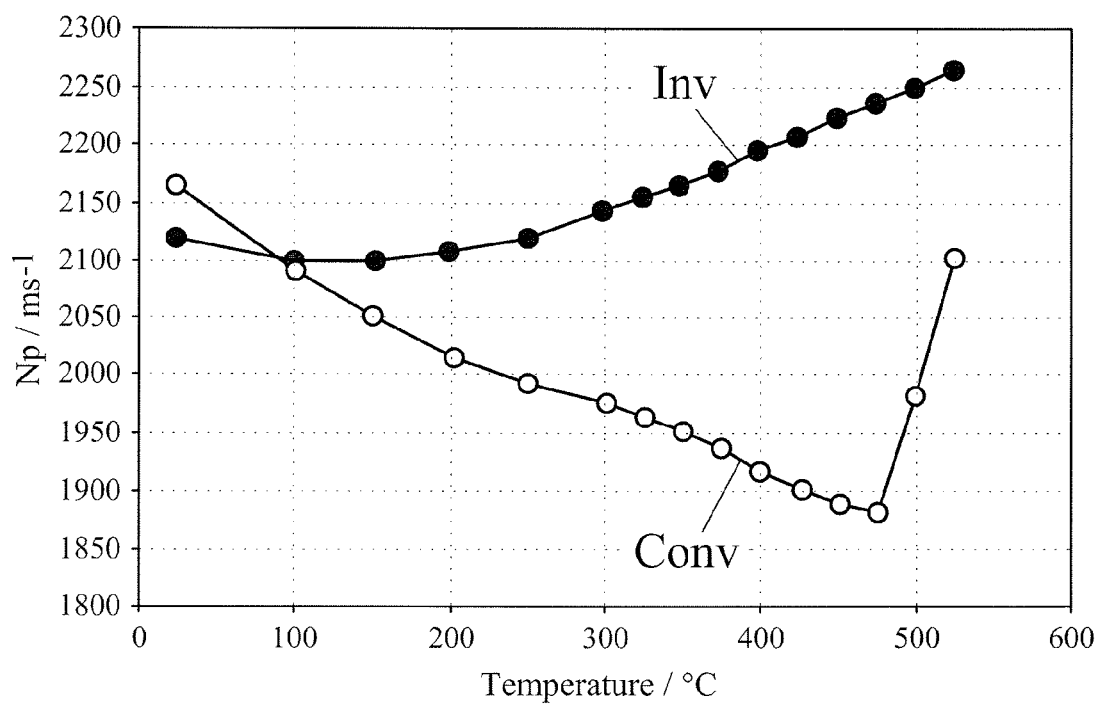
Figure 4:
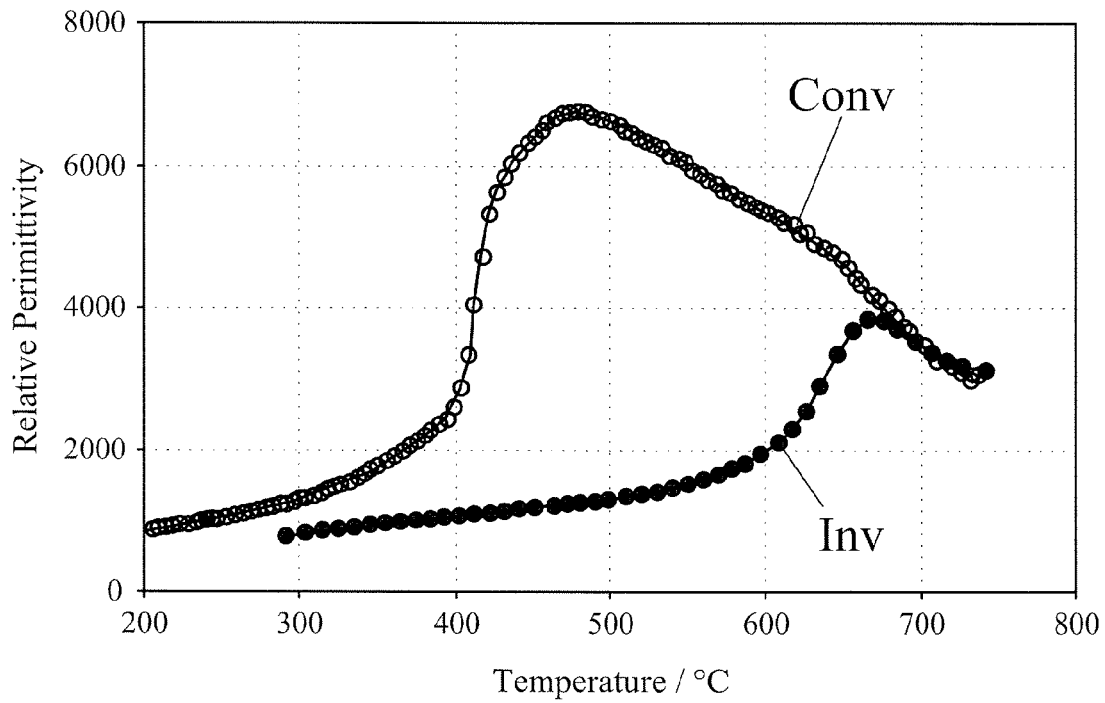
Figure 5:
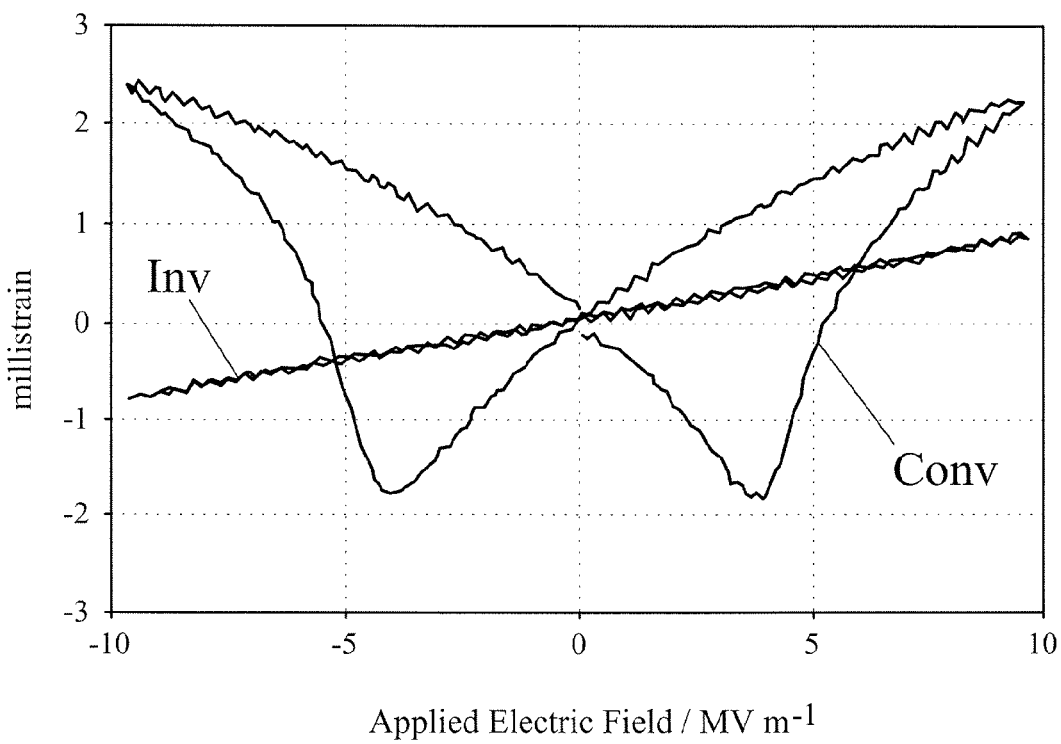
Figure 6:
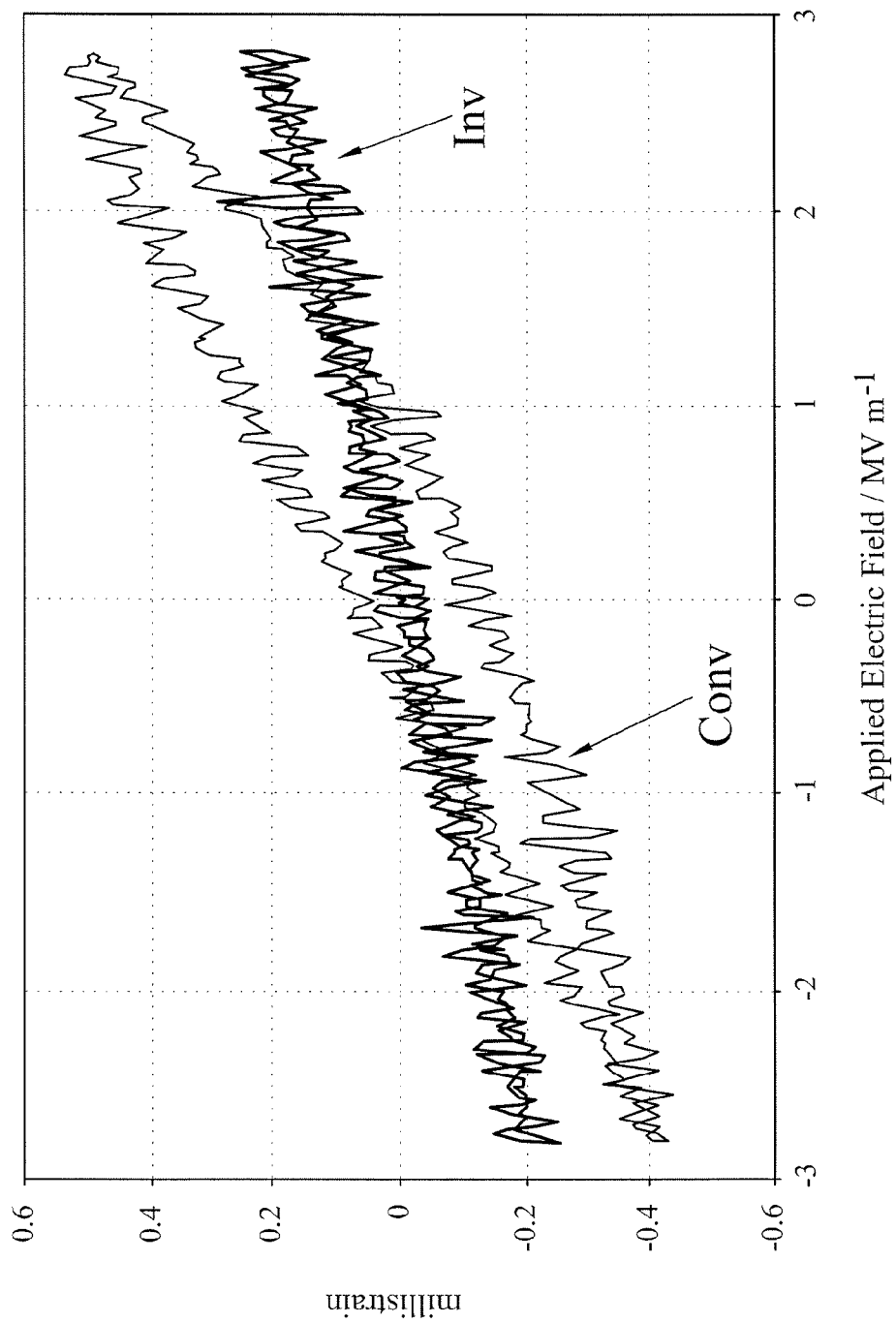
Figure 7:
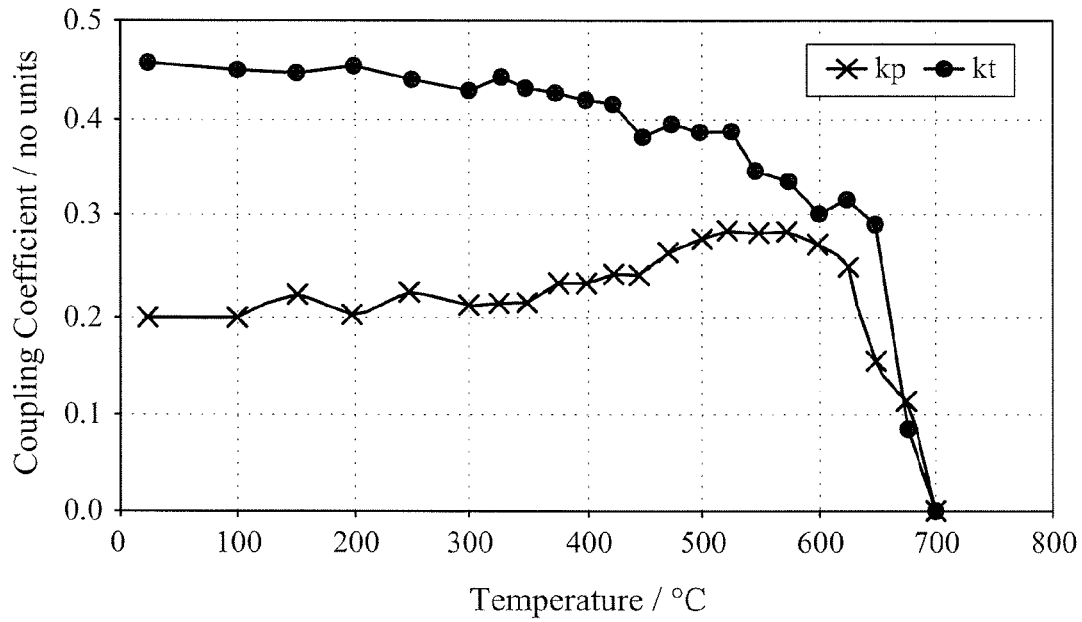
Figure 8:
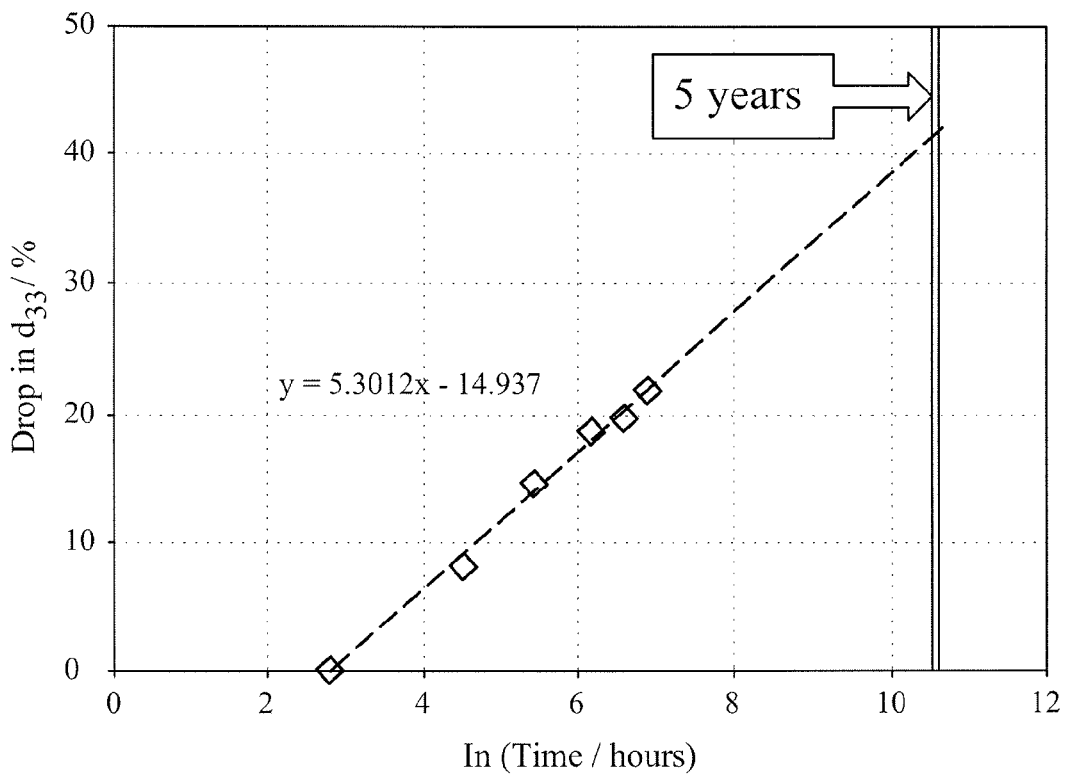
Figure 9:
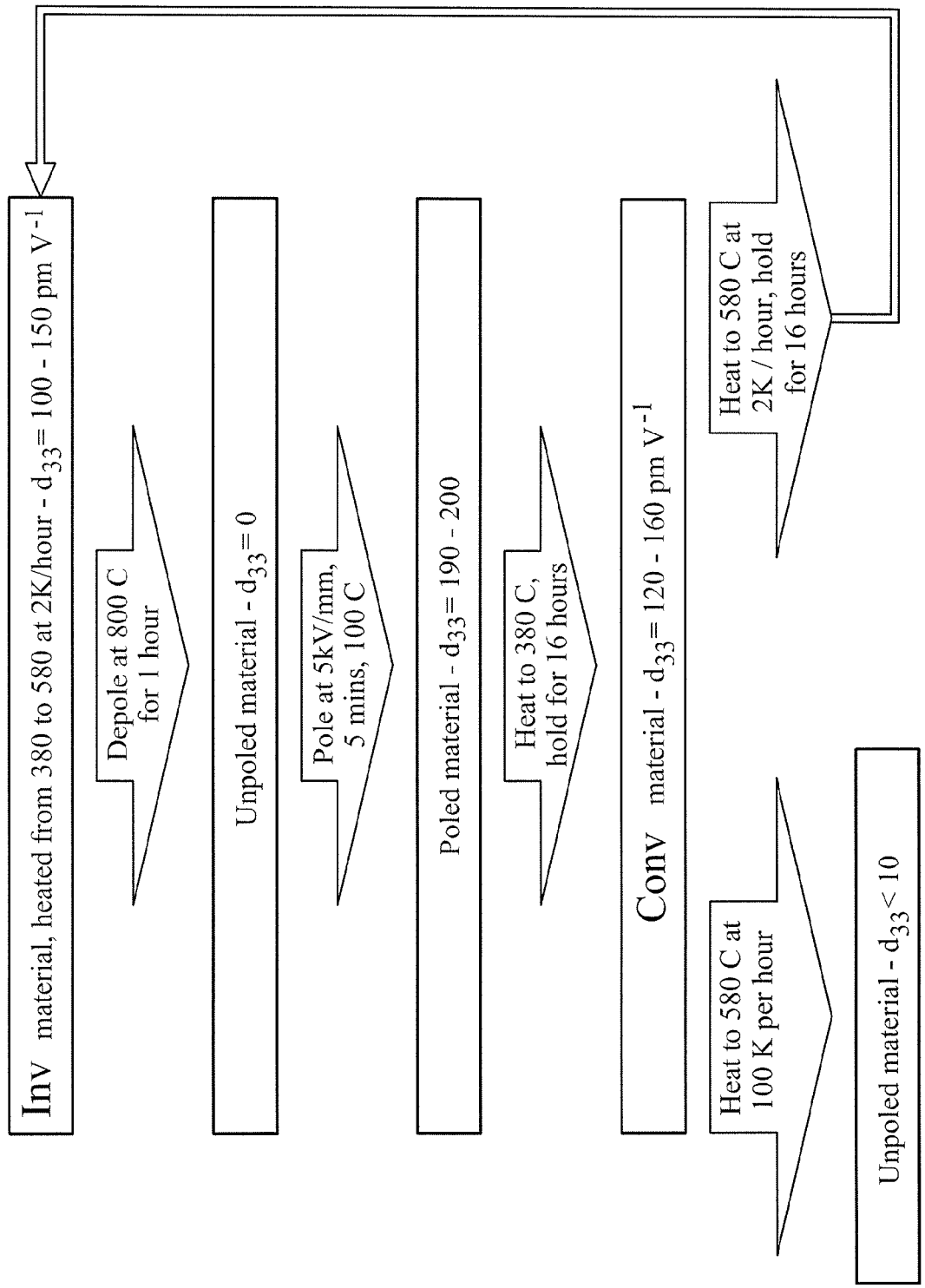

The present invention will now be described in a non-limitative sense with reference to the accompanying Figures in which:

FIG. 1—XRD patterns for (a) poled pellets which were annealed conventionally (conventional pellet—"Conv") and (b) poled pellets which were annealed in accordance with the invention (inventive pellet—"Inv");

FIG. 2—Tetragonality (c/a)–1 vs temperature for the inventive pellet;

FIG. 3—Radial mode frequency constant ($N_P$) vs temperature for the conventional pellet and the inventive pellet;

FIG. 4—Relative permittivity for the conventional pellet and the inventive pellet at 10 MHz;

FIG. 5—Strain field loops for the conventional pellet and the inventive pellet;

FIG. 6—Minor strain field loops for the conventional pellet and the inventive pellet driven with a maximum drive field <coercive field for the inventive pellet;

FIG. 7—Coupling coefficients ($k_t$ and $k_p$) for a disc of the inventive pellet;

FIG. 8—Plot of drop in $d_{33}$ vs ln (time/hours) for the inventive pellet soaked at 580° C. for extended periods; and FIG. 9—Flow diagram showing how the inventive pellet can be converted back into a conventional pellet or an inventive pellet after depoling at 800° C.

EXAMPLE 1

Experimental Procedure

Ground sintered pellets of a ceramic containing the solid solution 0.1875 ($Bi_{0.5}K_{0.5}$)$TiO_3$-0.5526 ($BiFeO_3$)-0.25625 ($PbTiO_3$) were made using the mixed oxide process described in WO-A-2012/013956.

A powder composed of mixed oxides was weighed out as shown in Table 1.

TABLE 1

| Reagent | Molecular Mass (g/mol) | Weight of Reagent (g) |
| --- | --- | --- |
| $Bi_2O_3$ | 465.957 | 258.512 |
| $Fe_2O_3$ | 159.687 | 75.816 |
| $K_2CO_3$ | 138.203 | 11.059 |
| PbO | 223.199 | 97.636 |
| $TiO_2$ | 79.865 | 60.499 |

The powder was dry milled to a particle size of <1 μm and then calcined at 800° C. for 6 hours. The calcined powder was dry milled to a particle size of 0.2 μm<$d_{50}$<0.8 μm. Addition of a binder-softener system (1 w/w % Zusoplast G63 and 3 w/w % Optapix AC112 from Zschimmer & Schwarze GmbH & Co KG) was required prior to spray drying of the resultant slurry.

The ceramic was produced by uni-axially pressing the powder at 50 MPa into 1 g of green pellets with a diameter of 12.5 mm. The binder was burnt out at a heating rate of 50° C./hour up to 600° C. Sintering was carried out on a powder bed on an alumina tile under an inverted alumina crucible (to minimise lead, bismuth or potassium loss) and conducted using a heating and cooling rate of 300° C./hour with a dwell of two hours at a temperature in the range 1000 to 1080° C. to deliver a dense ceramic (typically >95% dense).

The ceramic was prepared for testing by grinding (14 micron diamond paste) to form pellets with a diameter of 10.2 mm and a thickness of 0.36 mm. Electrodes were formed by applying silver termination ink (Gwent Electronic Materials) to opposite faces of the pellets and then firing according to the manufacturer's recommendations. The pellets were poled at a drive field of 5 kV/mm for 5 minutes at 100° C. Poling can alternatively be carried out at a drive field of 3.4 kV/mm for 2 minutes at 150° C. The voltage was raised at 50 V/s and removed over 10 seconds.

The poled pellets had a low field piezoelectric coefficient ($d_{33}$) of 180-200 pC/N (or pm/V) measured using a Berlincourt $d_{33}$ meter (APC International). The Berlincourt $d_{33}$ meter was validated by using PZT control samples (eg a 1 mm by 1 mm by 3.5 mm bar poled along the longest dimension) for which $d_{33}$ values have been calculated by resonance according to CENELAC EN 50324-2:2002 (Piezoelectric Properties of Ceramic Materials and Components—Part 2: Methods of Measurement and Properties—Low Power).

A sample of the poled pellets was placed on a clean alumina tile in a calibrated oven (UKAS accredited) in air. According to a conventional protocol, the sample of poled pellets was annealed by heating at 300° C./hour to 380° C. where it was held for 16 hours before being cooled rapidly (typically 1 hour). The annealed pellets had a $d_{33}$ value in the range 120-160 pC/N. Heating an annealed pellet at 120° C./hour to >580° C. where it was held for 16 hours caused piezoelectric activity to be almost entirely lost (<10 pC/N).

According to embodiments A to E of the process of the invention, a poled pellet placed on a clean alumina tile in the calibrated oven was annealed in air by heating at 300° C./hour to 380° C. and then at X° C./hour to 580° C. at which temperature it was held for 16 hours before being cooled rapidly at 300° C./hour to room temperature (or as fast as the oven would allow).

Results

The results of annealing according to embodiments A to E are set out in Table 2.

TABLE 2

Effect of annealing on the $d_{33}$ value of a poled pellet

| Embodiment | X | $d_{33}$ before heating at X° C./hour (pm V$^{-1}$) | $d_{33}$ after heating at X° C./hour (pm V$^{-1}$) | % drop |
|---|---|---|---|---|
| A | 1 | 150 | 102 | 32 |
| B | 2 | 144 | 100 | 31 |
| C | 4 | 144 | 102 | 30 |
| D | 8 | 141 | 61 | 57 |
| E | 100 | 128 | 5 | 96 |

The pellets depoled at >600° C. but heating slowly from 380 to 580° C. according to the process of the invention served to lock in the ability to work at 580° C.

X-Ray Diffraction (XRD)

FIG. 1(a) shows XRD data for the pellets which were annealed conventionally (conventional pellet—"Conv"). FIG. 1(b) shows XRD data for the pellets which were annealed according to the invention (inventive pellet—"Inv"). The data was gathered as follows.

The electrode surface of the poled pellets was removed by polishing with 2400 grit diamond to reveal a fresh ceramic surface. Scans of the surface were taken to a depth of <10 microns in the range 38 to 48° 2-theta using a Bruker D2 using Cu radiation. This range allowed the c/a ratio to be determined and the tetragonality and proportion of tetragonal phase to be defined. Because the materials were poled and the surface polished, there was residual stress present. Nevertheless as the pellets were prepared in exactly the same manner, the method can be used for comparative purposes.

In FIGS. 1(a) and (b), the peaks relating to the tetragonal phase T and the rhombohedral phase R are shown. The tetragonality (c/a)−1 was determined from the position of the peaks. The peak position in 2θ was used to determine the d-spacing according to Bragg's law ($n\lambda=2d \sin \theta$, where $n=1$ and $\lambda=1.54$ angstroms). The c/a ratio for the tetragonal phase was determined according to:

$$c/a = d\text{-spacing } T_{002}/d\text{-spacing } T_{200}$$

The proportion of the tetragonal phase was determined from the peak area of the two phases according to $$\text{Proportion tetragonal phase } P_T = 100 \frac{I(T_{002}) + I(T_{200})}{I(T_{002}) + I(T_{200}) + (R_{200})}$$

(where I is the intensity of the relevant peak determined by the area). The area was determined by minimising a least squared fit according to a pseudo-Voigt profile as is well known to those skilled in the art.

Table 3 shows the tetragonal strain and percentage of tetragonal phase ($P_T$) for the annealed pellets. The tetragonal strain and the proportion of the tetragonal phase was greater for the inventive pellet than for the conventional pellet.

TABLE 3

Tetragonality values (c/a-1) and percentage of tetragonal phase ($P_T$)

|  | c/a-1 | $P_T$ (%) |
|---|---|---|
| inventive pellet | 0.054 | 72 |
| conventional pellet | 0.040 | 45 |

In situ XRD was used to study the phase transition of the inventive pellet. Data was binned into data sets every 15° C. using a Bruker D8 with a constant heating rate of 4° C./hour from 380 to 635° C. From FIG. 2, it can be seen that the tetragonal strain started to increase at around 550° C. and reached a maximum at 605° C. This contradicts Landau theory which predicts that tetragonal strain will reduce with increasing temperature.

Physical and Electrical Properties

Comparative data is presented in Table 4 for various parameters (average value and standard deviation) gathered from 40 pellets (10.2 mm diameter, 0.36 mm thickness).

TABLE 4

| Parameter | | Unit | conventional pellet | standard deviation | inventive pellet | standard deviation | Effect +/− |
|---|---|---|---|---|---|---|---|
| $k_p$ | Radial coupling coefficient | n/a | 0.226 | 0.010 | 0.197 | 0.008 | − |

TABLE 4-continued

| Parameter | | Unit | conventional pellet | standard deviation | inventive pellet | standard deviation | Effect +/− |
|---|---|---|---|---|---|---|---|
| $N_p$ | Radial frequency constant | m/s | 2246 | 8 | 2196 | 17 | − |
| $k_t$ | Thickness coupling coefficient | n/a | 0.359 | 0.027 | 0.370 | 0.031 | + |
| $N_t$ | Thickness frequency constant | m/s | 1828 | 14 | 1705 | 18 | − |
| $\varepsilon_{33}$ | Relative Permittivity | F/m | 756 | 9 | 591 | 27 | − |
| D @ 1 kHz | Dielectric loss | $\times 10^{-3}$ | 26 | 1 | 17 | 2 | − |
| $d_{33}$ after processing | Measured using Berlincourt meter | pm/V | 135 | 13 | 117 | 6 | − |

Significantly there is a reduction in the dielectric loss and a slight increase in $k_t$. Of note is the fact that the temperature coefficient of the radial frequency constant $(N_P)$ is different for the conventional pellet and the inventive pellet as shown in FIG. 3. Between 150 and 450° C., the conventional pellet has a frequency constant which reduces with increasing temperature until depoling starts at between 450 and 550° C. On the other hand, the inventive pellet has a radial frequency constant $(N_P)$ which increases with increasing temperature.

The variation in permittivity vs temperature for the conventional pellet and the inventive pellet is shown in FIG. 4. Above 680° C., the data generally overlap and the assumption is that the Curie point $(T_C)$ is around 680° C. A maximum in permittivity was recorded at approximately 480° C. for the conventional pellet and 680° C. for the inventive pellet. Due to the difference in dielectric loss, strain field data was collected using a Radiant Ferroelectric tester with an MTI sensor in order to determine the losses during actuation. An electric field was applied and the strain generated was measured accurately using a non-contact thickness transducer. The sinusoidal voltage was applied with a frequency of 1 Hz.

FIG. 5 shows data collected with a maximum drive field of 9.6 MV m$^{-1}$. For the conventional pellet, a classical butterfly loop was observed. A coercive field (determined from the field at which the strain reverts to zero) for the conventional pellet was 5.4 MV m$^{-1}$ from an average of the positive and negative electric field excursions. A butterfly loop was not generated for the inventive pellet but instead the strain field response remained extremely linear. From a quadratic fit of the data, the hysteresis was just 3.0% from the breadth of the loop at the electric field=0 compared to the total strain. The coercive field of the inventive pellet was >9.6 MV m$^{-1}$ but it was poled at just 5 MV m$^{-1}$ at 100° C. This transformation is of significance. A material with a coercive field of >9.6 MV m$^{-1}$ would be very difficult to pole as dielectric breakdown is very likely at these voltages in a ceramic of this thickness.

FIG. 6 shows minor loops below the coercive field. The inventive pellet presented a far lower hysteresis than the conventional pellet. These are the sort of electric fields which are beneficial in piezoelectric actuators used for micropositioning where hysteresis poses a problem.

Piezoelectric Properties Vs Temperature

Impedance analysis was used to determine coupling coefficients of the inventive pellet over a range of temperature. The values were calculated according to CENELAC EN 50324-2:2002 (Piezoelectric Properties of Ceramic Materials and Components—Part 2: Methods of Measurement and Properties—Low Power). The planar mode coupling coefficient $(k_P)$ and thickness mode coupling coefficient $(k_t)$ were measured for discs which were 0.36 mm in thickness and 10.2 mm in diameter. Between each measurement, the temperature was increased at 5° C./min and held at the desired temperature for 20 minutes before data was collected.

As can be seen from FIG. 7, the piezoelectric activity is only lost entirely after 20 minutes at 700° C. Hence $T_c$ and the depolarisation temperature $(T_d)$ are substantially coincident.

Stability

The $d_{33}$ value was measured for 44 inventive pellets which had been soaked at 580° C. for 16 hours. The inventive pellets were then placed on a clean alumina tile in an oven and heated at 100° C./hour to 580° C. and held at this temperature for 72 hours. The oven was then cooled at 300° C./hour to room temperature. After 24 hours, the $d_{33}$ value of the pellets was measured again. This process was repeated for further periods of time of 144 hours at 580° C. (with the same heating and cooling process) and again for three further dwells at 250° C. The total time at 580° C. was 982 hours (including the initial 16 hours).

FIG. 8 shows that the drop in $d_{33}$ value vs ln (time in hours) is linear. The double line is data extrapolated to 5 years which predicts that the $d_{33}$ value has dropped by 42%. After 10 years there is a predicted drop of 45%. This anticipated long term stability of the material makes it viable for use at 580° C. for long periods. This is important in many industries such as the oil and gas industry and aerospace.

Reversibility

If an inventive pellet is heated to 800° C., piezoelectricity is lost (see FIG. 7). If the depoled pellet is re-poled and then annealed conventionally to 380° C., the same properties as the conventional pellet are attained. If however, the depoled pellet is repolled and annealed according to the invention, the same properties as the inventive pellet are re-attained. In other words, the properties of the inventive pellet are reversible and regenerable.

EXAMPLE 2

Further specific examples of ceramics in which the solid solution is of formula x $(Bi_aK_{1-a})TiO_3$-$yBiFeO_3$-$zPbTiO_3$ are shown in Table 5.

TABLE 5

| y | x | z |
|---|---|---|
| 0.725 | 0.1 | 0.175 |
| 0.7 | 0.1 | 0.2 |
| 0.7 | 0.125 | 0.175 |
| 0.675 | 0.1 | 0.225 |
| 0.675 | 0.125 | 0.2 |
| 0.675 | 0.15 | 0.175 |
| 0.65 | 0.1 | 0.25 |
| 0.65 | 0.125 | 0.225 |
| 0.65 | 0.15 | 0.2 |
| 0.65 | 0.175 | 0.175 |
| 0.65 | 0.2 | 0.15 |
| 0.625 | 0.1 | 0.275 |
| 0.625 | 0.125 | 0.25 |
| 0.625 | 0.15 | 0.225 |
| 0.625 | 0.175 | 0.2 |
| 0.625 | 0.2 | 0.175 |
| 0.6 | 0.1 | 0.3 |
| 0.6 | 0.125 | 0.275 |
| 0.6 | 0.15 | 0.25 |
| 0.6 | 0.175 | 0.225 |
| 0.6 | 0.2 | 0.2 |
| 0.6 | 0.225 | 0.175 |
| 0.575 | 0.1 | 0.325 |
| 0.575 | 0.125 | 0.3 |
| 0.575 | 0.15 | 0.275 |
| 0.575 | 0.175 | 0.25 |
| 0.575 | 0.2 | 0.225 |
| 0.575 | 0.225 | 0.2 |
| 0.575 | 0.25 | 0.175 |
| 0.55 | 0.1 | 0.35 |
| 0.55 | 0.125 | 0.325 |
| 0.55 | 0.15 | 0.3 |
| 0.55 | 0.175 | 0.275 |
| 0.55 | 0.2 | 0.25 |
| 0.55 | 0.225 | 0.225 |
| 0.55 | 0.25 | 0.2 |
| 0.55 | 0.275 | 0.175 |

Two of these ceramics (denoted a and b) were each subjected to Embodiments C and E of the process of the invention according to the test set out above in the Experimental Procedure.

| | | | |
|---|---|---|---|
| a: | 0.65 | 0.2 | 0.15 |
| b: | 0.6 | 0.15 | 0.25 |

TABLE 6

Effect of annealing on the $d_{33}$ value of poled pellets a and b

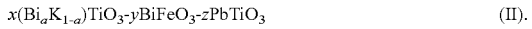

| | X | $d_{33}$ before heating at X° C./hour (pm V$^{-1}$) | $d_{33}$ after heating at X° C./hour (pm V$^{-1}$) | % drop |
|---|---|---|---|---|
| a | 4 | 102 | 75 | 26 |
| a | 100 | 104 | 6 | 94 |
| b | 4 | 131 | 113 | 14 |
| b | 100 | 128 | 8 | 94 |

The invention claimed is:

1. A process for annealing a poled ceramic which comprises a solid solution with a perovskite structure, wherein the process comprises:
   (A) heating the poled ceramic over a heating period from ambient temperature to a final temperature, wherein the final temperature is below the depolarization temperature of the poled ceramic, wherein during at least a final part of the heating period the temperature is raised incrementally; and
   (B) cooling the poled ceramic from the final temperature to ambient temperature to form an annealed poled ceramic.

2. A process as claimed in claim 1 wherein the final part of the heating period commences when the temperature is within 200° C. or more of the final temperature.

3. A process as claimed in claim 1 wherein during at least the final part of the heating period, the temperature is raised at an average heating rate of 8° C./hour or less.

4. A process as claimed in claim 1 further comprising:
   (A1) causing the poled ceramic to dwell for an intermediate period at an intermediate temperature between ambient temperature and the final temperature.

5. A process as claimed in claim 1 further comprising:
   (A2) causing the poled ceramic to dwell for an additional heating period at the final temperature.

6. A process as claimed in claim 1 wherein the solid solution is lead-containing.

7. A process as claimed in any of claim 1 wherein the solid solution is lead-free.

8. A process as claimed in claim 1 wherein the solid solution is of formula (I):

$$x(Bi_a[A]_{1-a})TiO_3\text{-}yBi_b[B]O_3\text{-}z[A']TiO_3 \qquad (I)$$

wherein:
[A] denotes sodium, potassium or lithium;
[B] denotes iron, lanthanum, indium, scandium or ytterbium;
[A'] denotes lead, barium, calcium, strontium or a mixture thereof;
$0.4 \leq a \leq 0.6$;
$0.7 \leq b \leq 1.0$;
$0 \leq x < 1$;
$0 \leq y < 1$; and
$0 < z \leq 0.5$,
wherein x+y>0 and x+y+z=1.

9. A process as claimed in claim 8 wherein the solid solution is of formula (II):

$$x(Bi_aK_{1-a})TiO_3\text{-}yBiFeO_3\text{-}zPbTiO_3 \qquad (II).$$

10. A process as claimed in claim 9 wherein 0<x<1 and 0<y<1.

11. A process as claimed in claim 8 wherein x is 0 and the solid solution is of formula (III):

$$yBiFeO_3\text{-}zBaTiO_3 \qquad (III)$$

wherein y is in the range 0.67 to 0.8.

* * * * *